(12) United States Patent
Yoshii et al.

(10) Patent No.: US 10,217,683 B2
(45) Date of Patent: Feb. 26, 2019

(54) MOUNTED SEMICONDUCTOR MODULE WITH A MOLD RESIN PORTION

(71) Applicant: Mitsubishi Electric Corporation, Tokyo (JP)

(72) Inventors: Dai Yoshii, Tokyo (JP); Masaaki Tanigawa, Tokyo (JP); Kensuke Takeuchi, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 0 days.

(21) Appl. No.: 15/541,919

(22) PCT Filed: May 13, 2015

(86) PCT No.: PCT/JP2015/063720
§ 371 (c)(1),
(2) Date: Jul. 6, 2017

(87) PCT Pub. No.: WO2016/181516
PCT Pub. Date: Nov. 17, 2016

(65) Prior Publication Data
US 2018/0053700 A1    Feb. 22, 2018

(51) Int. Cl.
*H01L 23/31* (2006.01)
*H01L 23/49* (2006.01)
(Continued)

(52) U.S. Cl.
CPC ............ *H01L 23/057* (2013.01); *H01L 23/28* (2013.01); *H01L 23/3114* (2013.01);
(Continued)

(58) Field of Classification Search
CPC ............... H01L 23/057; H01L 23/3114; H01L 23/49562; H01L 23/49575; H01L 24/48; H02M 7/003; H02M 7/538
See application file for complete search history.

(56) References Cited

U.S. PATENT DOCUMENTS 6,300,556 B1 * 10/2001 Yamagishi ............ H01L 31/048
136/251
8,130,499 B2 *  3/2012 Ohnishi ................ H01L 23/053
174/16.3
(Continued)

FOREIGN PATENT DOCUMENTS

JP        1-276752 A    11/1989
JP       05-166973 A    7/1993
(Continued)

OTHER PUBLICATIONS

Internal Search Report for PCT/JP2015/063720, dated Jul. 7, 2015.
(Continued)

*Primary Examiner* — Ida M Soward
(74) *Attorney, Agent, or Firm* — Sughrue Mion, PLLC; Richard C. Turner

(57) ABSTRACT

A semiconductor module is provided in which a semiconductor element is mounted and a plurality of outside connecting modules are drawn from a side of a mold resin portion. To ensure sufficient space for a holding tool used in mounting the semiconductor module to a device with a simple structure, holding side portions are provided for at least two opposing corner portions of corner portions between adjacent sides of the mold resin portion.

10 Claims, 3 Drawing Sheets

(51) Int. Cl.
  *H02M 7/00* (2006.01)
  *H02M 7/53* (2006.01)
  *H01L 23/057* (2006.01)
  *H01L 23/28* (2006.01)
  *H01L 23/495* (2006.01)
  *H01L 23/00* (2006.01)
  *H02M 7/538* (2007.01)
  *H02P 27/06* (2006.01)

(52) U.S. Cl.
  CPC .. *H01L 23/49562* (2013.01); *H01L 23/49575* (2013.01); *H01L 24/48* (2013.01); *H02M 7/003* (2013.01); *H02M 7/538* (2013.01); *H01L 2224/48245* (2013.01); *H01L 2924/13091* (2013.01); *H01L 2924/14252* (2013.01); *H02P 27/06* (2013.01)

(56) References Cited

U.S. PATENT DOCUMENTS

| | | | | |
|---|---|---|---|---|
| 8,269,246 | B2* | 9/2012 | Min | H01L 33/38 |
| | | | | 257/98 |
| 8,310,121 | B2* | 11/2012 | Fujita | B62D 5/0406 |
| | | | | 310/64 |
| 8,378,347 | B2* | 2/2013 | Shimizu | H01L 24/97 |
| | | | | 257/100 |
| 8,941,001 | B1* | 1/2015 | Basel | H01L 31/02366 |
| | | | | 136/256 |
| 9,000,553 | B2* | 4/2015 | Tokuyama | H01L 25/072 |
| | | | | 257/499 |
| 9,247,675 | B2* | 1/2016 | Higuchi | B60L 11/1803 |
| 2011/0310585 | A1 | 12/2011 | Suwa et al. | |
| 2013/0265724 | A1* | 10/2013 | Kaneko | H01L 21/50 |
| | | | | 361/715 |
| 2014/0042482 | A1* | 2/2014 | Kim | H01L 33/58 |
| | | | | 257/99 |
| 2014/0313806 | A1* | 10/2014 | Shinohara | H05K 7/20927 |
| | | | | 363/141 |
| 2015/0228852 | A1* | 8/2015 | Zhang | H01L 33/54 |
| | | | | 257/98 |
| 2015/0228867 | A1* | 8/2015 | Kim | H01L 33/505 |
| | | | | 362/97.1 |
| 2015/0243572 | A1* | 8/2015 | Albers | H01L 24/97 |
| | | | | 257/778 |
| 2015/0305188 | A1* | 10/2015 | Maeda | H05K 7/1432 |
| | | | | 361/728 |
| 2016/0007492 | A1* | 1/2016 | Suwa | H05K 7/1432 |
| | | | | 361/820 |
| 2017/0040907 | A1* | 2/2017 | Goto | H02M 3/28 |

FOREIGN PATENT DOCUMENTS

| | | |
|---|---|---|
| JP | 6-7248 U | 1/1994 |
| JP | 07-161875 A | 6/1995 |
| JP | 07-283344 A | 10/1995 |
| JP | 5532955 B2 | 6/2014 |

OTHER PUBLICATIONS

Communication dated Dec. 20, 2017 from the Japanese Patent Office in counterpart application No. 2017-517532.
Communication dated Oct. 22, 2018 from the European Patent Office in counterpart Application No. 15891840.9.
Communication dated Nov. 8, 2018 from the European Patent Office in counterpart Application No. 15891840.9.

* cited by examiner

MOUNTED SEMICONDUCTOR MODULE WITH A MOLD RESIN PORTION

This Application is a National Stage of International Application No. PCT/JP2015/063720 filed May 13, 2015, the contents of all of which are incorporated herein by reference in their entirety.

TECHNICAL FIELD

The present invention relates to semiconductor module having semiconductor elements contained therein.

BACKGROUND ART

Semiconductor modules having a plurality of semiconductor elements such as FETs contained therein are conventionally known. Such a semiconductor module is typically provided with a number of terminals connected to the semiconductor elements such that the terminals are drawn from the sides of the body of the semiconductor module. (See, for example, Patent Literature 1)

CITATION LIST

Patent Literature

PTL 1: Japanese Patent No. 5,532,955 (Paragraph 0044, FIGS. 4 and 5)

SUMMARY OF INVENTION

Problems that the Invention is to Solve

For mounting the semiconductor module as described above to various types of devices, the body of the semiconductor module is typically caught by a holding tool and the module is placed into the device. In the terminal structure of the conventional semiconductor module described in Patent Literature 1, however, the presence of each terminal drawn from the body makes it difficult to ensure sufficient space for holding the semiconductor module. Another known holding tool sucks and holds the body of the semiconductor module, but the suction technique is not achieved favorably due to the large size and heavy weight of the semiconductor module and concerns about attachment of foreign matters to a back face of the module during the suction of the face.

The present invention has been made to solve the conventional problems as described above, and it is an object thereof to provide a semiconductor module in which a hold portion of the semiconductor module to be captured by a holding tool is provided with a simpler structure.

Means for Solving the Problems

According to the present invention, a semiconductor module is provided in which a semiconductor element is mounted and a plurality of outside connecting terminals are drawn from a side of a mold resin portion. The mold resin portion of the semiconductor module includes a plurality of corner portions, and a holding side portion is provided for each of at least two opposing corner portions of the corner portions.

Advantage of Invention

According to the semiconductor module of the present invention, the holding side portions provided at the two opposing corner portions allow the mold resin portion to be held at positions other than the outside connecting terminals, facilitating mounting into a device.

These and other objects, features, and effects of the present invention will be apparent from the detailed description and drawings in the following embodiments.

MODE FOR CARRYING OUT THE INVENTION

Embodiment 1

An embodiment according to the present invention will hereinafter be described with reference to FIG. 1.

A semiconductor module according to the present invention is used for a power circuit in combination with a rotating electrical machine such as a motor and an alternator, is applied to a power electronic circuit used for the purpose of providing functions of a product with a smaller and compact size and a higher efficiency through an electro-mechanical integral structure, and in particular, has a semiconductor switching element contained therein.

Figure 1:
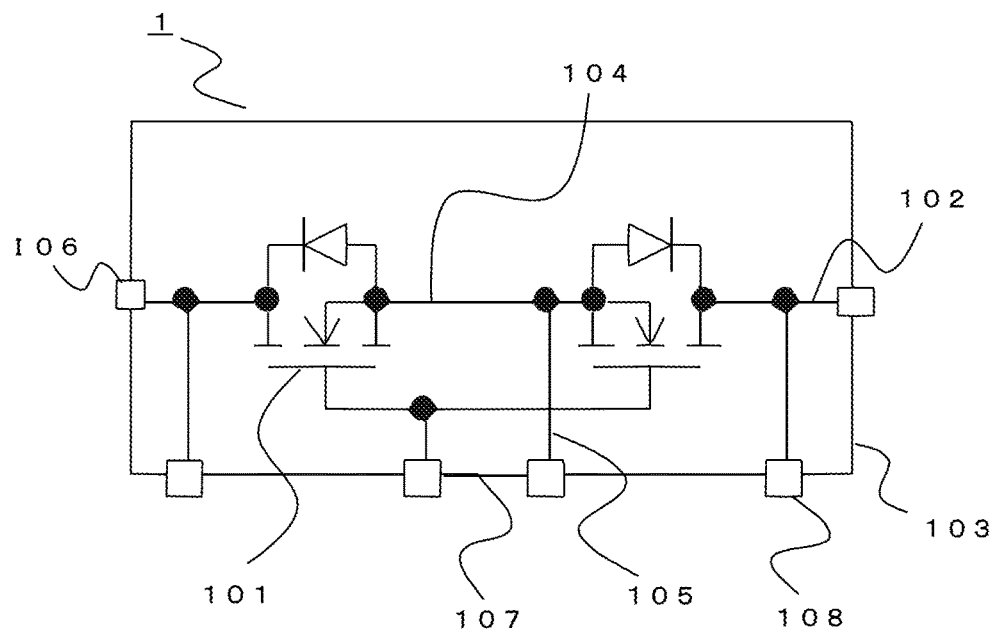
FIG. 1 is a circuit diagram showing electric circuitry included in a semiconductor module according to Embodiment 1 of the present invention.

FIG. 1 is a circuit diagram showing circuitry included in the semiconductor module. In FIG. 1, the semiconductor module 1 has two MOSFETs 101 constituting semiconductor switching elements, and a lead frame 102 connected to the MOSFETs 101, and is configured such that these components are encapsulated in and protected by a resin mold 103.

The semiconductor module 1 also has connecting members such as a clip lead 104 and a wire bond 105 within the resin mold 103, and these connecting members are connected with the lead frame 102. The lead frame 102 is drawn to the outside of the resin mold 103 through a resin mold outside connecting terminal 106. The semiconductor module 1 is integrated in one package and is configured to have, as a whole, a switch function for shutting off an inverter circuit driving power supply and a switch function for interrupting an overcurrent during reverse connection of a battery.

Signal terminals for control and voltage monitor of each MOSFET 101 are collected to and drawn from one side 107 of the resin mold 103 and are connected to an external control circuit. In addition, terminals are also drawn from both sides adjacent to the one side 107 of the resin mold 103 and are connected to other mechanism components constituting a control unit within limited space.

Figure 2:
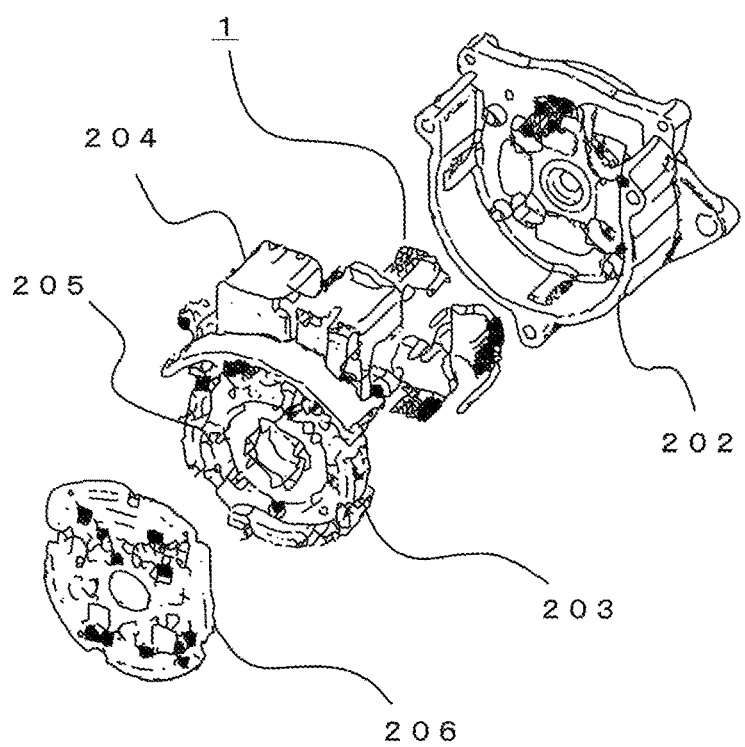
FIG. 2 is a developed view showing the general structure of a controller portion of a motor of electro-mechanical integral structure in which the semiconductor module according to Embodiment 1 of the present invention is mounted.

FIG. 2 is a developed view showing a controller (ECU: Electronic Control Unit) portion of a motor of electro-mechanical integral structure on which the semiconductor module according to Embodiment 1 of the present invention is mounted. FIG. 2 shows an exemplary structure of an inverter control unit.

The inverter unit includes a three-phase inverter driving circuit for driving a brushless DC motor and a circuit power supply shut-off circuit and constitutes a structure serving as a compact power pack module with an integral structure coaxial with the motor.

To achieve the coaxial integral structure, a housing 202 for housing the inverter control unit is made of material such as an aluminum die-casting alloy having both high heat dissipation and the above-mentioned mechanical rigidity since the housing 202 needs to function as a heat sink for heat loss in the semiconductor module 1.

The semiconductor module 1 is sandwiched between the housing 202 and a frame assembly 203 molded of resin and is fixed simultaneously with screwing of the frame assembly 203 to the housing 202. To ensure heat conduction and electrical insulation between a heat-dissipating face of the semiconductor module 1 and the heat sink provided by the housing 202, a heat-dissipating sheet, a grease and the like are intervened between them.

The frame assembly 203 has a bus bar 205 formed thereon for supplying power to the semiconductor module 1 such that the semiconductor module 1 receives electric power from outside through a connector assembly 204.

Signal pins of the semiconductor module 1 are connected to a control substrate 206 through through-holes formed in the frame assembly 203. Signal pins from a signal connecting portion of the connector assembly 204 are also connected to the control substrate 206.

Figure 3:
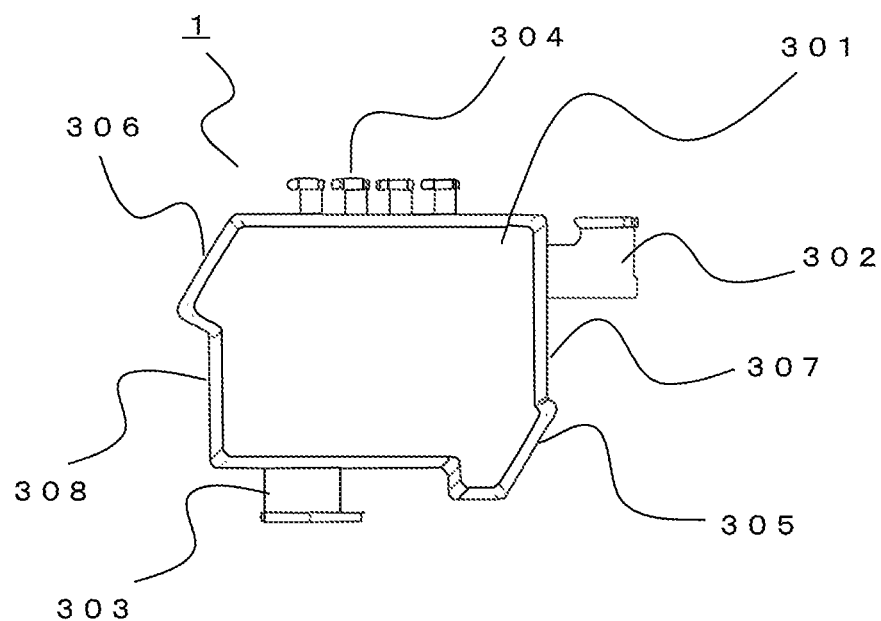
FIG. 3 is a plan view showing the outer shape of the semiconductor module according to Embodiment 1 of the present invention.

FIG. 3 is a schematic diagram showing the outer shape of the semiconductor module 1 according to Embodiment 1 of the present invention.

For mounting the semiconductor module 1 into a device such as the inverter control unit, a holding tool needs to catch a mold resin portion 301 serving as the body of the semiconductor module 1. In a structure in which a plurality of outside connecting terminals 302, 303, 304 are drawn from respective sides, the holding tool cannot be applied to two opposing faces, thereby preventing stable holding of the semiconductor module 1.

To address this in the present invention, as shown in FIG. 3, the mold resin portion 301 of the semiconductor module 1 is formed in a box shape in which an inclined holding side portion 305 is provided at a corner between adjacent sides of the box shape at an angle different from the angles of the planes of those sides and a holding side portion 306 is provided at the corner opposite to the holding side portion 305 in parallel with the holding side portion 305 through integral molding.

The parallel holding side portions 305 and 306 provided at the two opposing corners allow the mold resin portion 301 to be held at positions other than the outside connecting terminals 302, 303, 304, facilitating mounting into the device.

The pair of holding side portions 305 and 306 provided at the corners can prevent the holding tool from hitting the outside connecting terminal 302, 303, or 304 if the holding tool slips and fails to hold the mold resin portion 301 tightly.

The pair of holding side portions 305 and 306 is also advantageous in that, when opposing faces such as opposing faces 307 and 308 are provided but any component other than the semiconductor module 1 obstructs the holding of the module 1, the pair of holding side portions 305 and 306 provided at the corners can be held to facilitate the mounting to the device.

Embodiment 2

Figure 4:
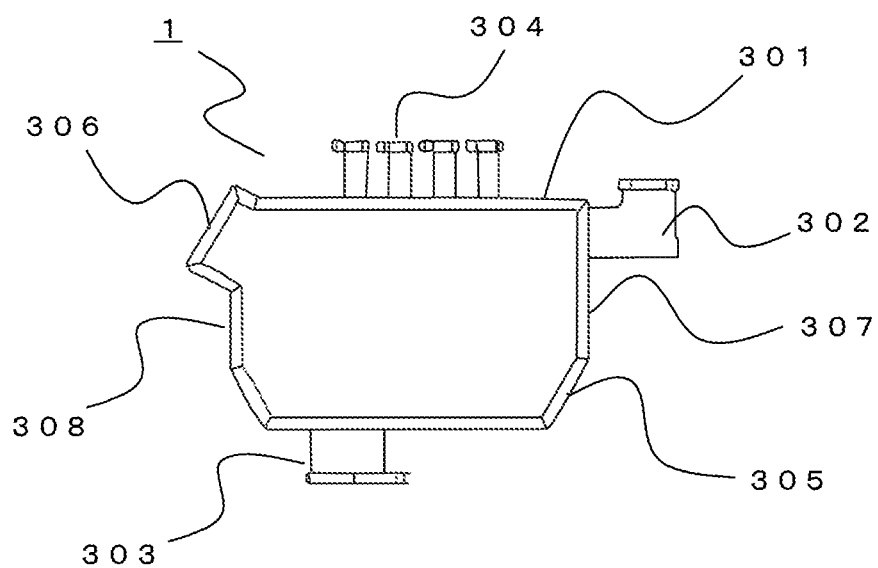
FIG. 4 is a plan view showing the outer shape of a semiconductor module according to Embodiment 2 of the present invention.

Next, Embodiment 2 of the present invention will hereinafter be described with reference to FIG. 4. In FIG. 4, components equivalent to those in Embodiment 1 are designated with the same reference numerals.

While Embodiment 1 includes the mold resin portion 301 having the outer shape formed in the box shape, Embodiment 2 is an example in which a mold resin portion 301 has an outer shape formed in a polygonal shape having sides more than four as shown in FIG. 4. Specifically, the mold resin portion 301 is configured such that a holding side portion 305 is provided at a corner between adjacent sides and a holding side portion 306 is provided at the opposing corner in parallel with the holding side portion 305. It should be noted that the mold resin portion 301 can be configured similarly when each side of the polygonal shape has a form other than a straight line.

The configuration described above allows similar effects to those in Embodiment 1 in the mold resin portion 301 that is not formed in the box shape.

Embodiment 3

Next, Embodiment 3 of the present invention will hereinafter be described with reference to FIG. 5.

Figure 5:
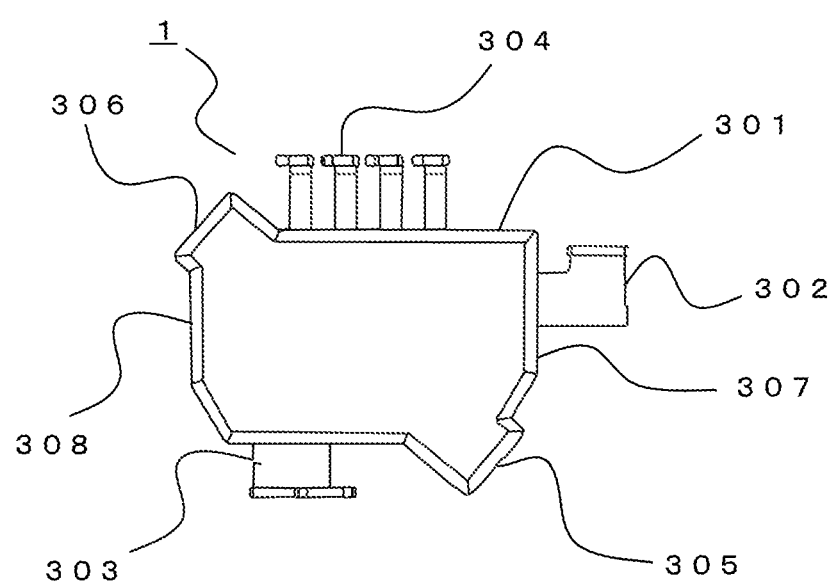
FIG. 5 is a plan view showing the outer shape of a semiconductor module according to Embodiment 3 of the present invention.

In FIG. 5, a mold resin portion 301 basically has a polygonal shape having sides more than four similarly to Embodiment 2 or a shape with each side having a form other than a straight line, a holding side portion 305 is formed at a corner between adjacent sides with its seat portion protruding from each of the adjacent sides, and a holding side portion 306 is provided at a portion opposing to the holding side portion 305 in parallel with the holding side portion 305 with its seat portion protruding from each adjacent side.

The parallel holding side portions 305 and 306 provided at the corners between the adjacent sides of the mold resin portion 301 can achieve the effects similar to those in Embodiment 1. The holding side portions 305 and 306 formed to protrude from each adjacent side in the mold resin portion 301 can prevent a disadvantage in which a holding tool hits an outside connecting terminal 302, 303, or 304 when the holding tool slips and fails to hold the body of the mold resin portion 301 tightly.

It should be noted that the term "parallel" holding side portions 305 and 306 do not require mathematical rigor but it is essential only that the holding side portions 305 and 306 be formed to the extent that they can be held. The holding side portions 305 and 306 may be provided in at least two opposing positions such as opposing corners of a box shape. Depending on the shape of a holding portion of the holding tool for catching the holding side portion, the two holding side portions 305 and 306 may not be parallel.

The present invention can be varied or omitted as appropriate without departing from the spirit or scope of the present invention.

REFERENCE SIGNS LIST

1: Semiconductor Module, 301: Mold Resin Portion, 302, 303, 304: Outside Connecting Terminals, 305, 306: Side Holding Portion

The invention claimed is:
1. A semiconductor module comprising:
a semiconductor element that is mounted;
a mold resin portion, wherein the mold resin portion comprises:
a plurality of sides;
a plurality of corner portions; and a holding side portion provided at each of at least two diagonally opposing corner portions, from among the plurality of corner portions; and a plurality of outside connecting modules drawn from a first side of the mold resin portion;

wherein a surface of at least one of the holding side portions is oblique relative to the first side of the mold resin portion.

2. The semiconductor module according to claim 1, wherein the holding side portion is integrally molded with the mold resin portion.

3. The semiconductor module according to claim 1, wherein the mold resin portion of the semiconductor module is formed in a box shape or a polygonal shape having sides more than four.

4. The semiconductor module according to claim 1, wherein the holding side portions provided for the at least two diagonally opposing corners are formed in parallel with or not in parallel with each other.

5. The semiconductor module according to claim 3, wherein the holding side portions provided for the at least two diagonally opposing corners are formed in parallel with or not in parallel with each other.

6. The semiconductor module according to claim 1, wherein the plurality of outside connecting terminals are placed only in a side of the mold resin portion.

7. The semiconductor module according to claim 3, wherein the plurality of outside connecting terminals are placed only in a side of the mold resin portion.

8. The semiconductor module according to claim 1, wherein the holding side portion is formed to have a seat portion protruding from a side of the mold resin portion, the plurality of outside connecting terminals being drawn from the side.

9. The semiconductor module according to claim 6, wherein the holding side portion is formed to have a seat portion protruding from the side of the mold resin portion, the plurality of outside connecting terminals being drawn from the side.

10. The semiconductor module according to claim 7, wherein the holding side portion is formed to have a seat portion protruding from the side of the mold resin portion, the plurality of outside connecting terminals being drawn from the side.

* * * * *